(12) United States Patent
Chang et al.

(10) Patent No.: US 10,312,207 B2
(45) Date of Patent: Jun. 4, 2019

(54) PASSIVATION SCHEME FOR PAD OPENINGS AND TRENCHES

(71) Applicant: Taiwan Semiconductor Manufacturing Co., Ltd., Hsin-Chu (TW)

(72) Inventors: Ming-Hong Chang, Hsin-Chu (TW); Chun-Yi Yang, Hsinchu (TW); Kun-Ming Huang, Taipei (TW); Po-Tao Chu, New Taipei (TW); Shen-Ping Wang, Keelung (TW); Chien-Li Kuo, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/883,797

(22) Filed: Jan. 30, 2018

(65) Prior Publication Data

US 2019/0019770 A1   Jan. 17, 2019

Related U.S. Application Data

(60) Provisional application No. 62/523,570, filed on Jul. 14, 2017.

(51) Int. Cl.
*H01L 23/00* (2006.01)
*H01L 23/528* (2006.01)
(Continued)

(52) U.S. Cl.
CPC .......... *H01L 24/05* (2013.01); *H01L 23/3171* (2013.01); *H01L 23/3178* (2013.01);
(Continued)

(58) Field of Classification Search
CPC ............ H01L 23/3171; H01L 23/3178; H01L 23/3192
(Continued)

(56) References Cited

U.S. PATENT DOCUMENTS 10,103,114 B2 *  10/2018  Lin .................... H01L 24/05
2011/0193232 A1   8/2011  Chen et al.
(Continued)

FOREIGN PATENT DOCUMENTS

CN         101814477 A       8/2010

OTHER PUBLICATIONS

Valentas, et al. "Handbook of Food Engineering Practice." ISBN # 1420049070, CRC Press, published in 1997.
(Continued)

*Primary Examiner* — Mark V Prenty
(74) *Attorney, Agent, or Firm* — Eschweiler & Potashnik, LLC

(57) ABSTRACT

An integrated circuit (IC) comprising an enhanced passivation scheme for pad openings and trenches is provided. In some embodiments, an interlayer dielectric (ILD) layer covers a substrate and at least partially defines a trench. The trench extends through the ILD layer from a top of the ILD layer to the substrate. A conductive pad overlies the ILD layer. A first passivation layer overlies the ILD layer and the conductive pad, and further defines a pad opening overlying the conductive pad. A second passivation layer overlies the ILD layer, the conductive pad, and the first passivation layer, and further lines sidewalls of the first passivation layer in the pad opening and sidewalls of the ILD layer in the trench. Further, the second passivation layer has a low permeability for moisture or vapor relative to the ILD layer.

20 Claims, 13 Drawing Sheets

(51) Int. Cl.
*H01L 23/522* (2006.01)
*H01L 23/31* (2006.01)
*H01L 23/29* (2006.01)

(52) U.S. Cl.
CPC ........ *H01L 23/528* (2013.01); *H01L 23/5226* (2013.01); *H01L 24/03* (2013.01); *H01L 23/291* (2013.01); *H01L 23/293* (2013.01); *H01L 23/3114* (2013.01); *H01L 23/3192* (2013.01); *H01L 23/564* (2013.01); *H01L 2224/0391* (2013.01); *H01L 2224/03831* (2013.01); *H01L 2224/05025* (2013.01); *H01L 2224/05124* (2013.01); *H01L 2224/05147* (2013.01); *H01L 2924/1033* (2013.01)

(58) Field of Classification Search
USPC ........................................................ 257/635
See application file for complete search history.

(56) References Cited

U.S. PATENT DOCUMENTS

| | | |
|---|---|---|
| 2013/0087908 A1 | 4/2013 | Yu et al. |
| 2015/0194455 A1 | 7/2015 | Ho et al. |

OTHER PUBLICATIONS

EESemi.com. Temperature, Humidity, Bias (THB) Test. The date of publication is unknown. Copyright 2001-2005. Retrieved Jul. 12, 2017 from http://www.eesemi.com/THM.htm.

\* cited by examiner

PASSIVATION SCHEME FOR PAD OPENINGS AND TRENCHES

REFERENCE TO RELATED APPLICATION

This Application claims the benefit of U.S. Provisional Application No. 62/532,570, filed on Jul. 14, 2017, the contents of which are hereby incorporated by reference in their entirety.

BACKGROUND

Semiconductor devices based on silicon have been the standard for the past few decades. However, semiconductor devices based on alternative materials are receiving increasing attention for advantages over silicon-based semiconductor devices. For example, semiconductor devices based on group III-V semiconductor materials have been receiving increased attention due to high electron mobility and wide band gaps compared to silicon-based semiconductor devices. Such high electron mobility and wide band gaps allow improved performance and high temperature applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
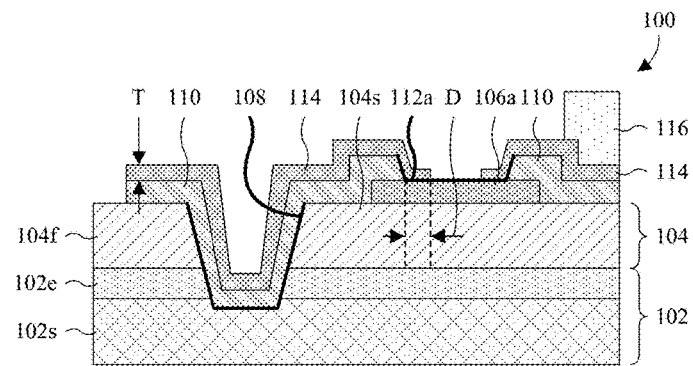
FIG. 1 illustrates a cross-sectional view of some embodiments of an integrated circuit comprising an enhanced passivation scheme for pad openings and trenches.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some situations, an integrated circuit (IC) comprises a bulk silicon substrate and a gallium nitride (GaN) layer covering the bulk silicon substrate. A plurality of GaN semiconductor devices are in a top of the GaN layer, and an interconnect structure covers the GaN semiconductor devices and the GaN layer. The interconnect structure comprises an interlayer dielectric (ILD) layer and a passivation layer covering the ILD layer. Further, the interconnect structure comprises a plurality of conductive features. The conductive features comprise a plurality of wires, a plurality of vias, and a plurality of pads. The pads are on the ILD layer, between the ILD layer and the passivation layer. The wires and the vias are alternatingly stacked in the ILD layer and define conductive paths electrically coupling the pads to the GaN semiconductor devices. Pad openings are defined by the passivation layer, and respectively overlie and expose the pads. A through GaN trench is defined by the passivation layer, the ILD layer, and the GaN layer. The through GaN trench extends vertically through the passivation layer, the ILD layer, and the GaN layer to the bulk silicon substrate, and further extends laterally in a closed path to completely enclose the GaN semiconductor devices and the pads. The through GaN trench serves as a seal ring to prevent moisture and/or vapor from entering the IC from an ambient environment of the IC. Moisture and/or vapor that enter the IC can cause corrosion to the conductive features and/or to the GaN semiconductor devices. Further, the seal ring prevents cracks caused by a die saw from propagating though the IC during singulation of a wafer upon which the IC is manufactured in bulk.

A challenge with the IC is that the IC fails temperature, humidity, bias (THB) coupon testing. THB coupon testing is a process in which a bare IC die is mounted to a bare printed circuit board (PCB) and undergoes THB testing. The bare IC die and the bare PCB define a coupon (e.g., a simplified/open package devoid of molding compound). Because the IC die is "bare", the THB testing is performed under some of the worst conditions possible. During the THB coupon testing, moisture or vapor (e.g., water vapor) enters the IC through weak points along sidewalls of the through GaN trench and sidewalls of the pad openings. For example, the ILD layer and the first passivation layer may be or comprise silicon dioxide, which has a high permeability for moisture and/or vapor and is hence a weak point in the sidewalls of the through GaN trench and the sidewalls of the pad openings. Moisture or vapor that enters the IC through the weak points may cause the THB coupon testing to fail by, for example, damaging the GaN semiconductor devices or the conductive features, and/or by, for example, causing delamination of the passivation layer. As to the latter, the moisture or vapor may lead to cracks at oxide interfaces along the sidewalls of the through GaN trench and the sidewalls of the pad openings. For example, a crack may form on a sidewall of the through GaN trench at an oxide-to-oxide interface between the ILD layer and the passivation layer. As another example, a crack may form on a sidewall of a pad opening at an oxide-to-metal interface between the passivation layer and a pad corresponding to the pad opening. The cracks, in turn, may allow more moisture and/or vapor to enter the IC, and may further cause delamination of the passivation layer.

In view of the foregoing, various embodiments of the present application are directed towards an IC comprising an enhanced passivation scheme for pad openings and trenches. In some embodiments, the IC comprises a substrate, an ILD layer, a conductive pad, a first passivation layer, and a second passivation layer. The ILD layer covers the substrate and at least partially defines a trench. The trench extends through the ILD layer from a top of the ILD layer to the substrate. The conductive pad overlies the ILD layer. The first passivation layer overlies the ILD layer and the conductive pad, and defines a pad opening overlying the conductive pad. The second passivation layer overlies the ILD layer, the conductive pad, and the first passivation layer, and further lines first sidewalls of the first passivation layer in the pad opening and second sidewalls of the first passivation layer in the trench. Further, the second passivation layer lines sidewalls of the ILD layer in the trench. In some embodiments, the second passivation layer directly lines the sidewalls of the ILD layer in the trench. In other embodiments, the first passivation layer directly lines the sidewalls of the ILD layer and the second passivation layer lines the sidewalls of the ILD layer over the first passivation layer. The second passivation layer has a low permeability for moisture and/or vapor relative to the ILD layer.

By lining the sidewalls of the first passivation layer and the ILD layer in the trench, the second passivation layer may cover weak points in the trench and the pad opening through which moisture and other gases may enter the IC. For example, the ILD layer and the first passivation layer may be or comprise silicon dioxide, which has a high permeability for moisture and/or vapor and is hence a weak point in the trench and the pad opening. Further, because the second passivation layer has a low permeability for moisture and/or vapor, the second passivation layer may prevent moisture and/or vapor from entering the IC through the weak points. Therefore, the second passivation layer may allow the IC to pass THB coupon testing. Further, the second passivation layer may prevent delamination of the first passivation layer, damage to semiconductor devices in the substrate, damage to conductive features (e.g., wires, vias, etc.) in the ILD layer and the first passivation layer, or any combination of the foregoing.

With reference to FIG. 1, a cross-sectional view 100 of some embodiments of an IC comprising an enhanced passivation scheme for pad openings and trenches is provided. As illustrated, a substrate 102 supports an ILD layer 104. The substrate 102 may be or comprise, for example, a bulk monocrystalline silicon substrate, some other suitable bulk silicon substrate, some other suitable bulk semiconductor substrate, a silicon-on-insulator (SOI) substrate, a gallium nitride (GaN) layer, some other suitable group III-V layer, some other suitable semiconductor layer or substrate, or any combination of the foregoing. In some embodiments, the substrate 102 comprises a semiconductor substrate 102s and an epitaxial layer 102e covering the semiconductor substrate 102s. The semiconductor substrate 102s may be or comprise, for example, a bulk monocrystalline silicon substrate or some other suitable semiconductor substrate. The epitaxial layer 102e may be or comprise, for example, a group III-V semiconductor material, a group II-VI semiconductor material, a group IV-IV semiconductor material, or some other suitable semiconductor material. For example, the epitaxial layer 102e may be or comprise, for example, gallium nitride (GaN) or some other suitable semiconductor material.

The ILD layer 104 overlies the substrate 102, and a pad 106a overlies the ILD layer 104. The ILD layer 104 may be or comprise, for example, silicon dioxide, silicon nitride, a low κ dielectric, some other suitable dielectric, or any combination of the foregoing. As used herein, a low κ dielectric is a dielectric with a dielectric constant κ less than about 3.9, 3, 2, or 1. In some embodiments, the ILD layer 104 is homogeneous (e.g., a single material), and/or is or comprises silicon dioxide or some other suitable dielectric. The pad 106a is conductive and may be or otherwise comprise, for example, copper, aluminum copper, aluminum, some other suitable metal or metal alloy, or any combination of the foregoing. In some embodiments, the pad 106a is electrically coupled to a semiconductor device (not shown) in the substrate 102 by vias (not shown) and wires (not shown) alternatingly stacked in the ILD layer 104.

A trench 108 is adjacent to the pad 106a, and is at least partially defined by the ILD layer 104 and the substrate 102. For example, the ILD layer 104 and the substrate 102 may define sidewalls of the trench 108, and the substrate 102 may further define a bottom surface of the trench 108. The trench 108 extends vertically through the ILD layer 104 to the substrate 102 and, in some embodiments, also extends vertically through the epitaxial layer 102e to the semiconductor substrate 102s. In some embodiments, the trench 108 also extends laterally in a closed path to completely enclose the pad 106a. Note that this is not visible within the cross-sectional view 100 of FIG. 1. The trench 108 separates the ILD layer 104 into a first portion 104f and a second portion 104s respectively on opposite sides of the trench 108, and the pad 106a overlies the second portion 104s of the ILD layer 104.

A first passivation layer 110 overlies the ILD layer 104 and trench 108, and a portion of the first passivation layer 110 is recessed into the trench 108. The first passivation layer 110 lines sidewalls of the trench 108 and, in some embodiments, a bottom surface of the trench 108. The first passivation layer 110 also overlies the pad 106a and defines a pad opening 112a overlying the pad 106a. In some embodiments, the first passivation layer 110 extends continuously from directly over the first portion 104f of the ILD layer 104 to directly over the pad 106a through the trench 108. In some embodiments, a portion of the first passivation layer 110 in the trench 108 has a U-shaped or V-shaped cross-sectional profile. The first passivation layer 110 may be or otherwise comprise, for example, silicon dioxide, aluminum oxide, silicon nitride, some other suitable dielectric, or any combination of the foregoing. In some embodiments, the first passivation layer 110 and the ILD layer 104 directly contact along a top surface of the ILD layer 104 at an oxide-to-oxide interface, and/or the first passivation layer 110 and the pad 106a directly contact along a top surface of the pad 106a at an oxide-to-metal interface.

A second passivation layer 114 overlies the first passivation layer 110, and a portion of the second passivation layer 114 is recessed into the trench 108. The second passivation layer 114 lines sidewalls of the first passivation layer 110 in the trench 108 and, in some embodiments, further lines a recessed upper surface of the first passivation layer 110 in the trench 108. Further, the second passivation layer 114 lines sidewalls of the trench 108 over the first passivation layer 110 and, in some embodiments, further lines a bottom surface of the trench 108 over the first passivation layer 110.

In some embodiments, a portion of the second passivation layer 114 in the trench 108 has a U-shaped or V-shaped cross-sectional profile. The second passivation layer 114 also overlies the pad 106a and lines sidewalls of the pad opening 112a. Further, the second passivation layer 114 partially lines a bottom surface of the pad opening 112a. In some embodiments, the second passivation layer 114 extends at least a distance D along the bottom surface of the pad opening 112a, from each sidewall of the pad opening 112a towards a center of the pad opening 112a. In some embodiments, the distance D is about 8-10 micrometers, about 5-20 micrometers, or about 8-9 micrometers. For example, the distance D may be about 8.7 micrometers. In some embodiments, the second passivation layer 114 extends continuously from directly over the first portion 104f of the ILD layer 104 to directly over the pad 106a through the trench 108. Further, in some embodiments, the second passivation layer 114 has a thickness T between about 200-1000 nanometers, between about 200-500 nanometers, between about 500-1000 nanometers, between about 300-700 nanometers, or greater than about 200 nanometers.

The second passivation layer 114 has a lower permeability for moisture and/or vapor than the ILD layer 104 and, in some embodiments, the first passivation layer 110. For example, the second passivation layer 114 may have a lower permeability for water vapor than the ILD layer 104 and/or the first passivation layer 110. In some embodiments, the second passivation layer 114 also has a low water vapor transmission rate (WVTR) relative to the ILD layer 104 and/or the first passivation layer 110. For example, the low WVTR may be less than about $5 \times 10^{-5}$, $10^{-6}$, or $3.5 \times 10^{-4}$ grams per square meter per day (g/m²/day), and/or between about $10^{-6}$-$10^{-3}$ g/m²/day, about $3 \times 10^{-5}$-$7 \times 10^{-5}$ g/m²/day, or about $3 \times 10^{-5}$-$7 \times 10^{-5}$ g/m²/day. The second passivation layer 114 may be or comprise, for example, silicon nitride, polyimide, aluminum oxide, some other suitable dielectric, or any combination of the foregoing.

By lining the sidewalls of the trench 108 and the sidewalls of the pad opening 112a, the second passivation layer 114 covers weak points in the trench 108 and the pad opening 112a through which moisture and/or vapor may enter the IC. For example, the ILD layer 104 and the first passivation layer 110 may be or comprise silicon dioxide, which has a high permeability for moisture and/or vapor and is hence a weak point in the trench 108 and the pad opening 112a. Further, because the second passivation layer 114 has a low permeability for moisture and/or vapor, the second passivation layer 114 may prevent moisture and/or vapor from entering the IC through the weak points. Therefore, the second passivation layer 114 may allow the IC to pass THB coupon testing. Further, the second passivation layer 114 may prevent delamination of the first passivation layer 110, damage to semiconductor devices (not shown) in the substrate 102, damage to conductive features (not shown) in the ILD layer 104 and the first passivation layer 110, or any combination of the foregoing.

In some embodiments, a third passivation layer 116 overlies the second passivation layer 114, such that the pad 106a is spaced from and between the trench 108 and the third passivation layer 116. The third passivation layer 116 may be or comprise, for example, polyimide, some other suitable dielectric, or any combination of the foregoing. Further, the third passivation layer 116 may be or comprise, for example, a material with a lower permeability for moisture and/or vapor than the ILD layer 104 and/or the first passivation layer 110. In some embodiments, the third passivation layer 116 has a lower permeability for water vapor than the ILD layer 104 and/or the first passivation layer 110. Further, the third passivation layer 116 may be or comprise, for example, a material with a lower WVTR than the ILD layer 104 and/or the first passivation layer 110.

In some embodiments, the first passivation layer 110 is or comprises silicon dioxide or some other suitable dielectric, the second passivation layer 114 is or comprises silicon nitride or some other suitable dielectric, the ILD layer 104 is or comprise silicon dioxide or some other suitable dielectric, and the third passivation layer 116 is or comprises polyimide or some other suitable dielectric. Further, in some embodiments, the first passivation layer 110, the second passivation layer 114, the ILD layer 104, the third passivation layer 116, or any combination of the foregoing is/are each homogeneous (e.g., a single material).

Figure 2A:
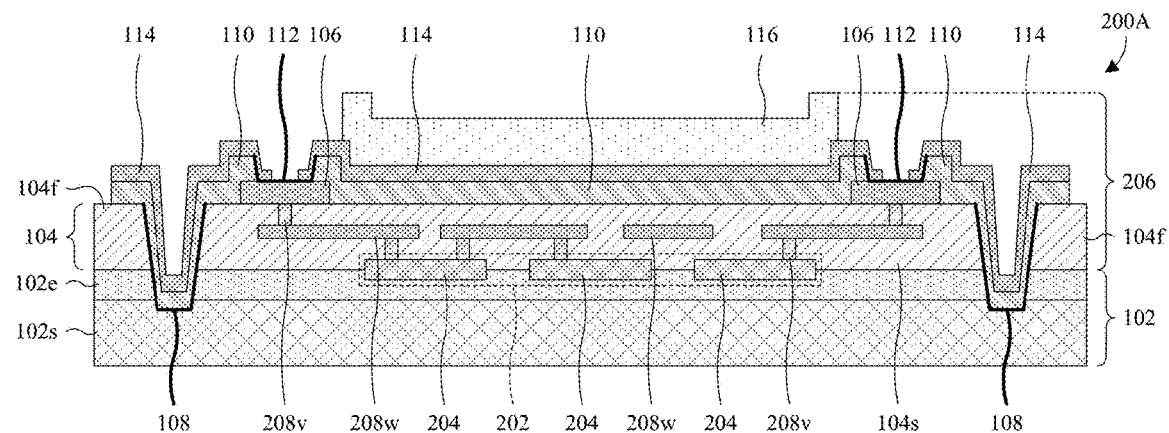
FIGS. 2A-2C illustrate various views of some more detailed embodiments of the integrated circuit of FIG. 1.
Figure 2B:
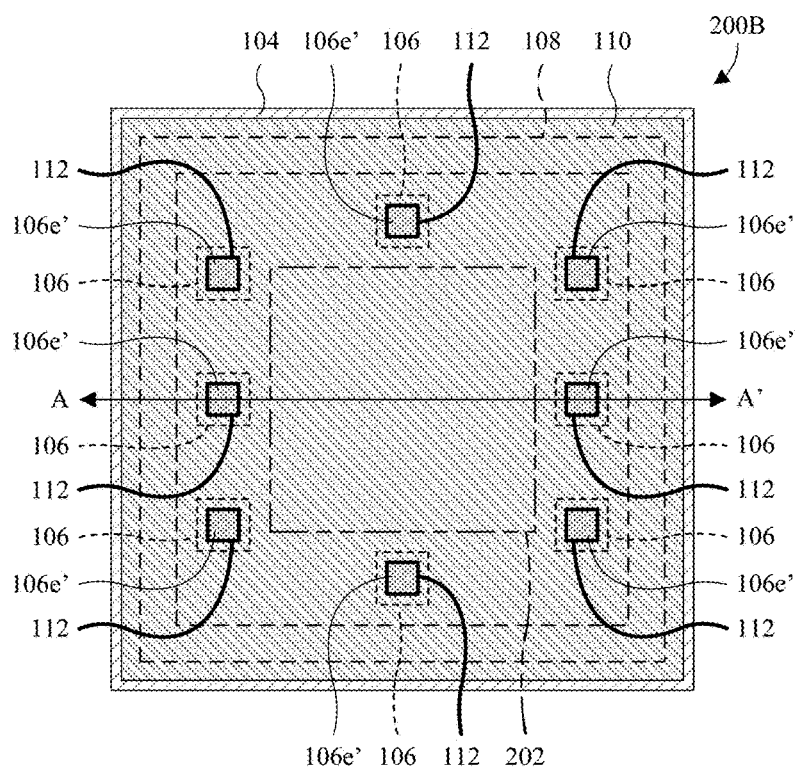
Figure 2C:
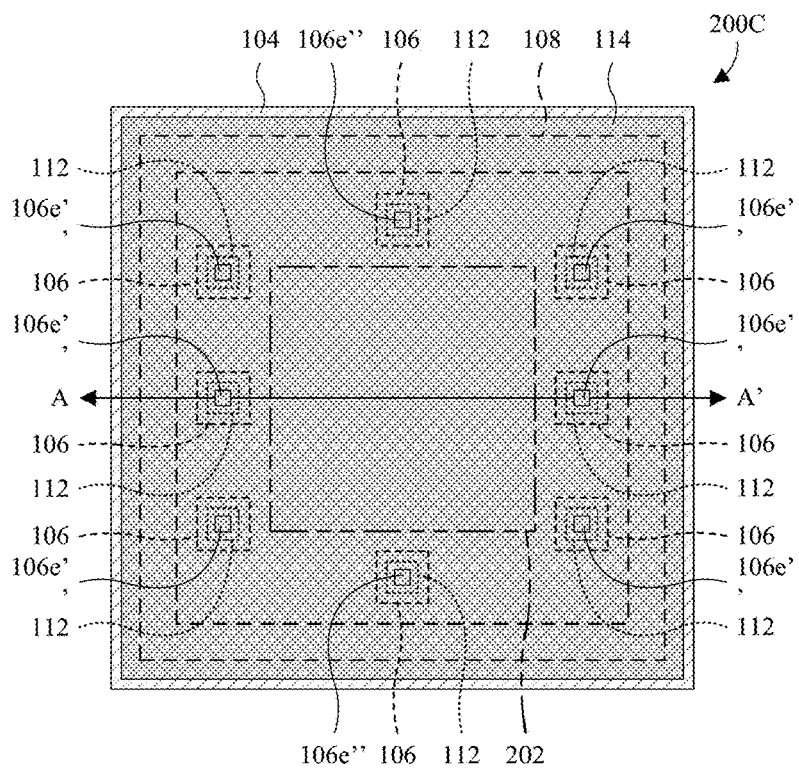

With reference to FIGS. 2A-2C, various views 200A, 200B, 200C of some more detailed embodiments of the IC of FIG. 1 are provided. FIG. 2A illustrates a cross-sectional view 200A of the IC taken along lines A-A' in FIGS. 2B and 2C. FIG. 2B illustrates a top view 200B of the IC in which the second and third passivation layers 114, 116 have been omitted. FIG. 2C illustrates a top view 200C of the IC in which the second passivation layer 114 is included, but the third passivation layer 116 is omitted.

As illustrated by the cross-sectional view 200A of FIG. 2A, a semiconductor device layer 202 overlies and is partially defined by the substrate 102. The semiconductor device layer 202 comprises a plurality of semiconductor devices 204. In some embodiments, at least some (e.g., all) of the semiconductor devices 204 are defined by the epitaxial layer 102e. Further, in some embodiments, at least some (e.g., all) of the semiconductor devices 204 are defined by the semiconductor substrate 102s. The semiconductor devices 204 may be or comprise, for example, group III-V transistors, silicon transistors, some other suitable semiconductor devices, or any combination of the foregoing.

An interconnect structure 206 covers the substrate 102 and the semiconductor device layer 202, and comprises a dielectric stack and a plurality of conductive features. The dielectric stack comprises the ILD layer 104, the first passivation layer 110, and the second passivation layer 114. The first passivation layer 110 overlies the ILD layer 104, and the second passivation layer 114 overlies the first passivation layer 110. In some embodiments, the dielectric stack further comprises the third passivation layer 116, and the third passivation layer 116 overlies the second passivation layer 114. The conductive features comprise a plurality of wires 208w, a plurality of vias 208v, and a plurality of pads 106. For ease of illustration, only some of the wires 208w are labeled 208w, and only some of the vias 208v are labeled 208v.

The wires 208w, the vias 208v, and the pads 106 are alternatingly stacked in the dielectric stack. The pads 106 overlie the ILD layer 104, between the ILD layer 104 and the first passivation layer 110. The pads 106 may, for example, each be as the pad 106a of FIG. 1 is shown and/or described. Further, the pads 106 respectively underlie pad openings 112 defined by the first passivation layer 110. The pad openings 112 may, for example, each be as the pad opening 112a of FIG. 1 is shown and/or described. The vias 208v and the wires 208w are stacked under the pads 106, and further define conductive paths electrically coupling the pads 106 to the semiconductor devices 204. In some embodiments, the vias 208v each extend vertically from one of the wires 208w to another one of the wires 208w, one of the pads 106, one of the semiconductor devices 204, or some other type of conductive feature. Further, in some embodiments, the wires 208w each extend laterally from one of the vias 208v to another one of the vias 208v. Note that this may not be visible within the cross-sectional view 200A of FIG. 2A. The conductive features may be or comprise, for example, copper, aluminum, aluminum copper, tungsten, some other suitable metal or metal alloy, or any combination of the foregoing.

The trench 108 is at least partially defined by the ILD layer 104 and the substrate 102, and extends laterally in a closed path to completely enclose semiconductor devices 204 and the interconnect structure 206. Note that this is not visible within the cross-sectional view 200A of FIG. 2A, but is visible within the top views 200B, 200C of FIGS. 2B and 2C. Further, the trench 108 separates the ILD layer 104 into the first portion 104f and the second portion 104s. The second portion 104s of the ILD layer 104 is at a center of the IC, and the first portion of the ILD layer 104 is at a periphery of the IC. In some embodiments, the second portion 104s of the ILD layer 104 has a planar top layout that is circular, and/or the first portion 104f of the ILD layer 104 has a planar top layout that is ring shaped. Note that this is not visible within the cross-sectional view 200A of FIG. 2A.

As illustrated by the top view 200B of FIG. 2B, the trench 108 (shown in phantom) extends laterally in a closed path to completely enclose the pads 106 (shown in phantom) and the semiconductor device layer 202 (shown in phantom). In some embodiments, the trench 108 has a planar top layout that is ring shaped or ring shaped like. As used herein, ring shaped like may, for example, be ring shaped not limited to circular sidewalls. The first passivation layer 110 covers the trench 108 and, in some embodiments, the semiconductor device layer 202. Further, the first passivation layer 110 partially covers the pads 106 and defines the pad openings 112 respectively overlying the pads 106. Due to the pad openings 112, the pads 106 respectively have first exposed portions 106e' uncovered by the first passivation layer 110.

As illustrated by the top view 200C of FIG. 2C, the second passivation layer 114 covers the trench 108 (shown in phantom) and the first passivation layer 110 (not shown). In some embodiments, the second passivation layer 114 also covers the semiconductor device layer 202 (shown in phantom). Further, the second passivation layer 114 partially covers the pads 106 (shown in phantom) and the pad openings 112 (shown in phantom). Because the second passivation layer 114 partially covers the pad openings 112, the pads 106 respectively have second exposed portions 106e" uncovered by both the first and second passivation layer 110, 114. As should be appreciated, the second exposed portions 106e" are subsets of and/or overlap with the first exposed portions 106e' of FIG. 2B.

With reference to FIGS. 3A-3F, cross-sectional views 300A-300F of various alternative embodiments of the IC of FIG. 1 are provided. Unless noted otherwise, the various features of FIGS. 3A-3F may, for example, be as described with regard to FIG. 1. Further, the alternative embodiments of any one of FIGS. 3A-3F may, for example, be employed within the IC of FIGS. 2A-2C in place of the embodiments of FIG. 1. For example, the trench 108 of FIGS. 2A-2C may be lined and/or covered by the first, second, and third passivation layers 110, 114, 116 as shown in any one of the FIGS. 3A-3F, and/or the pad openings 112 of FIGS. 2A-2C may each be covered and/or lined by the first, second, and third passivation layers 110, 114, 116 as shown for the pad opening 112a in any one of FIGS. 3A-3F.

Figure 3A:
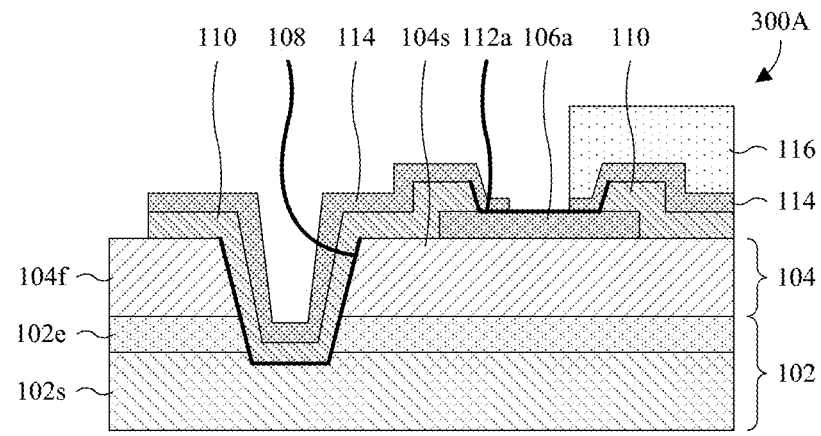
FIGS. 3A-3F illustrate cross-sectional views of various alternative embodiments of the integrated circuit of FIG. 1.

As illustrated by the cross-sectional view 300A of FIG. 3A, the third passivation layer 116 partially fills the pad opening 112a over the second passivation layer 114, and further lines a sidewall of the pad opening 112a over the second passivation layer 114. In some embodiments, a sidewall of the third passivation layer 116 overlies and is aligned to a sidewall of the second passivation layer 114 in the pad opening 112a. Further, the third passivation layer 116 is spaced from a first side of the pad opening 112a that neighbors the trench 108 and that is opposite a second side of the pad opening 112a upon which the sidewall of the pad opening 112a is located. As described above, the third passivation layer 116 may be or comprise, for example, a material with a lower permeability for moisture and/or vapor than the ILD layer 104 and/or the first passivation layer 110. Therefore, by lining the sidewall of the pad opening 112a, the third passivation layer 116 may aid the second passivation layer 114 in preventing moisture and/or vapor from entering the IC through the sidewall of the pad opening 112a.

Figure 3B:
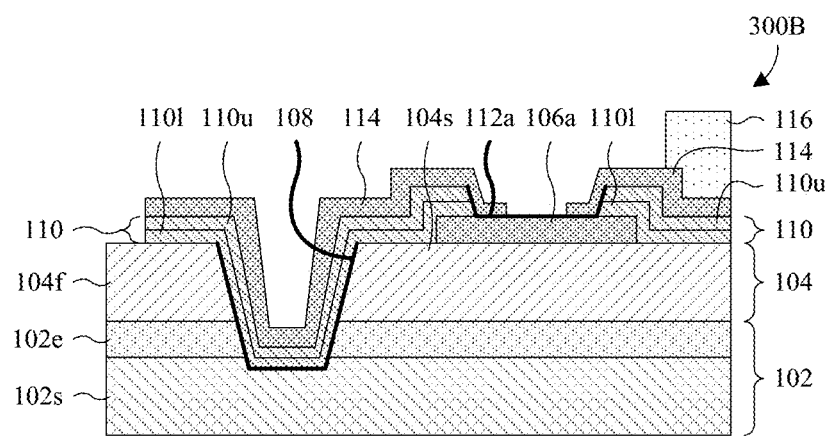

As illustrated by the cross-sectional view 300B of FIG. 3B, the first passivation layer 110 comprises a lower layer 110l and an upper layer 110u. The lower and upper layers 110l, 110u are different materials, and the upper layer 110u covers the lower layer 110l. The lower and upper layers 110l, 110u may, for example, each be or comprise silicon dioxide, aluminum oxide, silicon nitride, some other suitable dielectric, or any combination of the foregoing. Further, the lower layer 110l may be or comprise, for example, a material with a lower permeability for moisture and/or vapor than the ILD layer 104, the upper layer 110u, the second passivation layer 114, or any combination of the foregoing Therefore, since the lower layer 110l lines sidewalls of the trench 108, the lower layer 110l may aid the second passivation layer 114 in preventing moisture and/or vapor from entering the IC through the sidewalls of the trench 108. Further, since the lower layer 110l partially defines sidewalls of the pad opening 112a, the lower layer 110l may aid the second passivation layer 114 in preventing moisture and/or vapor from entering the IC through the sidewalls of the pad opening 112a. In some embodiments, the lower layer 110l also has a lower WVTR than the ILD layer 104, the upper layer 110u, the second passivation layer 114, or any combination of the foregoing.

In some embodiments, the ILD layer 104 is or comprises silicon dioxide or some other suitable dielectric, the second passivation layer 114 is or comprise silicon nitride or some other suitable dielectric, the lower layer 110l is or comprises aluminum oxide or some other suitable dielectric, and the upper layer 110u is or comprises silicon dioxide or some other suitable dielectric. Note that aluminum oxide has a lower permeability than silicon nitride and silicon dioxide. Further, in some embodiments, the ILD layer 104, the second passivation layer 114, the lower layer 110l, and the upper layer 110u, or any combination of the foregoing is/are each homogeneous (e.g., a single material).

Figure 3C:
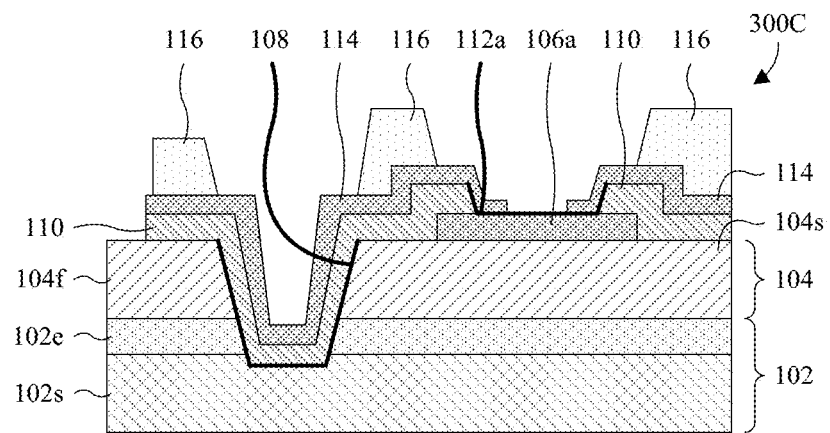

As illustrated by the cross-sectional view 300C of FIG. 3C, the third passivation layer 116 comprises a trio of passivation segments overlying the second passivation layer 114. The trench 108 and the pad opening 112a are between a first passivation segment of the trio and a second passivation segment of the trio, and a third passivation segment of the trio is between the trench 108 and the pad opening 112a. In some embodiments, the third passivation layer 116 is continuous from each passivation segment of the trio to each other passivation segment of the trio outside the cross-sectional view 300C. Further, in some embodiments, the first passivation layer 110 is or comprises silicon dioxide or some other suitable dielectric; the second passivation layer 114 is or comprises silicon nitride, aluminum oxide, or some other suitable dielectric; and the third passivation layer 116 is or comprises polyimide or some other suitable dielectric.

Figure 3D:
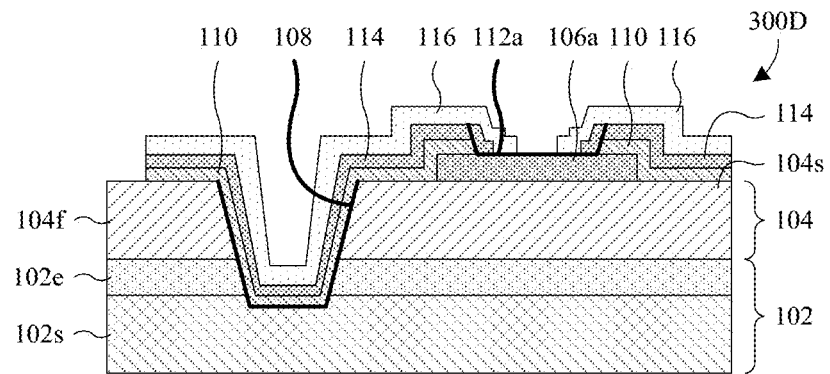

As illustrated by the cross-sectional view 300D of FIG. 3D, the third passivation layer 116 lines sidewalls of the trench 108 over the second passivation layer 114, and further lines sidewalls of the pad opening 112a over the second passivation layer 114. In some embodiments, a portion of the third passivation layer 116 in the trench 108 has a U-shaped or V-shaped cross-sectional profile. Further, the third passivation layer 116 partially covers the pad 106a adjacent to the second passivation layer 114, such that a portion of the pad 106a remains exposed to an ambient environment of the IC.

Figure 3E:
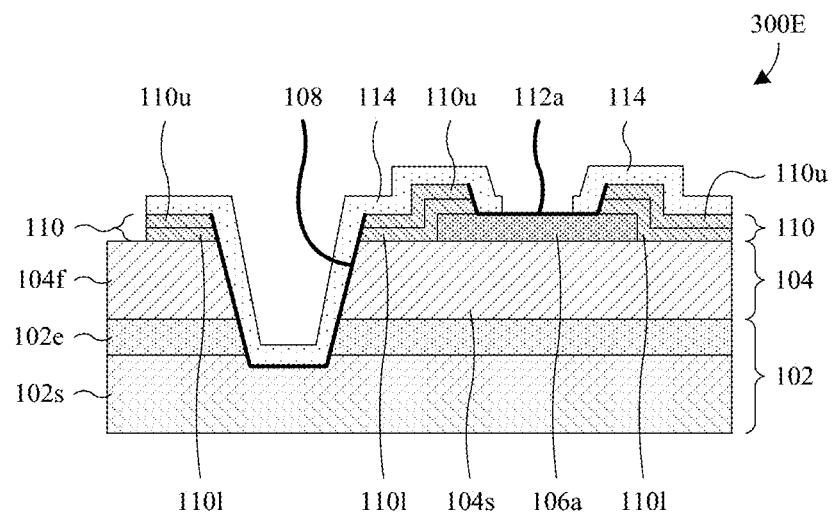

As illustrated by the cross-sectional view 300E of FIG. 3E, the first passivation layer 110 comprises a lower layer 110l and an upper layer 110u. In some embodiments, the third passivation layer 116 (see, e.g., FIG. 1) is further omitted. The lower and upper layers 110l, 110u are different materials, and the upper layer 110u covers the lower layer 110l. The lower layer 110l may be or comprise, for example, silicon dioxide or some other suitable dielectric, and/or the upper layer 110u may be or comprise, for example, silicon nitride or some other suitable dielectric. Further, the upper layer 110u may be or comprise, for example, a material with a lower permeability for moisture and/or vapor than the ILD layer 104, the lower layer 110l, or any combination of the foregoing. In some embodiments, the upper layer 110u also has a lower WVTR than the ILD layer 104, the lower layer 110l, or any combination of the foregoing.

In some embodiments, the ILD layer 104 is or comprises silicon dioxide or some other suitable dielectric, the second passivation layer 114 is or comprise polyimide or some other suitable dielectric, the lower layer 110l is or comprises silicon dioxide or some other suitable dielectric, and the upper layer 110u is or comprises silicon nitride or some other suitable dielectric. Further, in some embodiments, the ILD layer 104, the second passivation layer 114, the lower layer 110l, and the upper layer 110u, or any combination of the foregoing is/are each homogeneous (e.g., a single material).

Figure 3F:
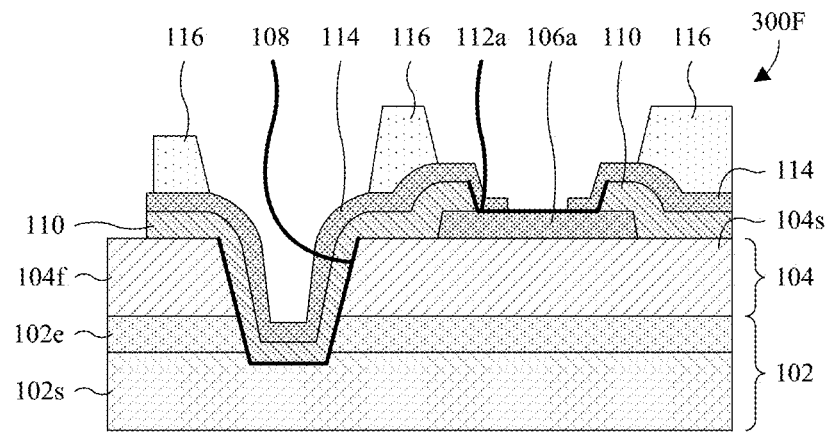

As illustrated by the cross-sectional view 300F of FIG. 3F, a variant of FIG. 3C is provided in which the first passivation layer 110 and the second passivation layer 114 have curved profiles.

While FIGS. 1, 2A, and 3A-3F illustrate an epitaxial layer 102e between the ILD layer 104 and the semiconductor substrate 102s, the epitaxial layer 102e may be omitted in other embodiments. In such other embodiments, the semiconductor substrate 102s may, for example, fill the space previously occupied by the epitaxial layer 102e.

With reference to FIGS. 4-11, a series of cross-sectional views 400-1100 of some embodiments of a method for manufacturing an IC with an enhanced passivation scheme for pad openings and trenches is provided. The method is illustrated with respect to FIG. 1, but may also be employed to manufacture the ICs of FIGS. 3A-3D.

Figure 4:
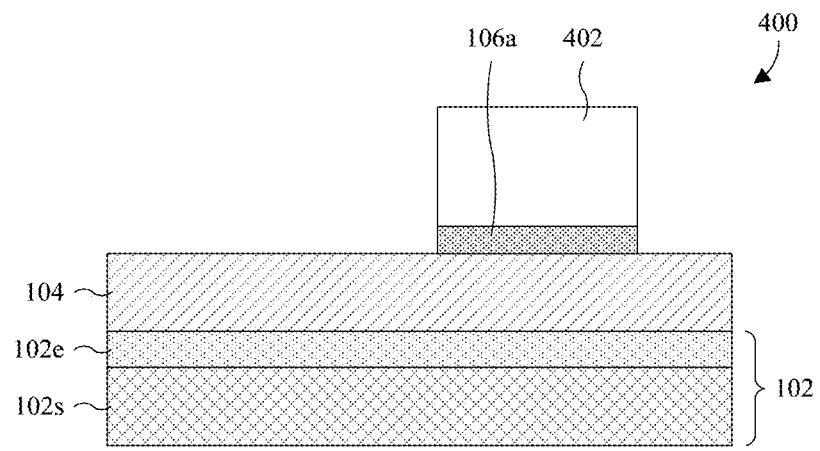
FIGS. 4-11 illustrate a series of cross-sectional views of some embodiments of a method for manufacturing an integrated circuit with an enhanced passivation scheme for pad openings and trenches.

As illustrated by the cross-sectional view 400 of FIG. 4, a substrate 102 and an ILD layer 104 are provided. The substrate 102 supports the ILD layer 104 and may be or comprise, for example, a bulk monocrystalline silicon substrate, some other suitable bulk silicon substrate, some other suitable bulk semiconductor substrate, a SOI substrate, a GaN layer, some other suitable group III-V layer, some other suitable semiconductor layer or substrate, or any combination of the foregoing. In some embodiments, the substrate 102 comprises a semiconductor substrate 102s and an epitaxial layer 102e covering the semiconductor substrate 102s. The semiconductor substrate 102s may be or comprise, for example, monocrystalline silicon or some other suitable semiconductor material, and/or the epitaxial layer 102e may be or comprise, for example, gallium nitride, some other suitable group III-V semiconductor material, a group II-VI semiconductor material, a group IV-IV semiconductor material, or some other suitable semiconductor. The ILD layer 104 may be or comprise, for example, silicon dioxide, silicon nitride, a low κ dielectric, some other suitable dielectric, or any combination of the foregoing. In some embodiments, the ILD layer 104 is homogeneous (e.g., a single material).

Also illustrated by the cross-sectional view 400 of FIG. 4, a pad 106a is formed atop the ILD layer 104. The pad 106a may be or comprise, for example, copper, aluminum copper, aluminum, titanium nitride, some other suitable metal or metal alloy, or any combination of the foregoing. In some embodiments, the pad 106a is electrically coupled to semiconductor devices (not shown) in a top of the substrate 102 by conductive features (not shown) stacked in the ILD layer 104. See, for example, the semiconductor devices 204 in FIG. 2A and the wires and vias 208w, 208v in FIG. 2A. The conductive features may be or comprise, for example, wires, vias, or some other suitable conductive features, and/or the semiconductor devices may be or comprise, for example, GaN semiconductor devices, silicon semiconductor devices, or some other suitable semiconductor devices. Further, the conductive features and the ILD layer 104 collectively define an interconnect structure. See, for example, the interconnect structure 206 of FIG. 2A.

In some embodiments, a process for forming the pad 106a comprises depositing a conductive layer covering the ILD layer 104, and subsequently patterning the conductive layer into the pad 106a. The depositing of the conductive layer may, for example, be performed by chemical vapor deposition (CVD), physical vapor deposition (PVD), electroless plating, electroplating, some other suitable deposition or plating process, or any combination of the foregoing. The patterning of the conductive layer may, for example, be performed by a photolithography/etching process or some other suitable patterning process. In some embodiments, the photolithography/etching process comprises depositing a first photoresist layer 402 on the conductive layer, patterning the first photoresist layer 402 with a pattern of the pad 106a, performing an etch into the conductive layer with the first photoresist layer 402 in place to transfer the pattern to the conductive layer, and removing the first photoresist layer 402. As used here, the depositing of a photoresist layer may, for example, be performed by spin on coating or some other suitable deposition process. As used herein, the patterning of a photoresist layer may, for example, be performed by a photolithography process or some other suitable patterning process. As used herein, the removing of a photoresist layer may, for example, be performed by plasma ashing or some other suitable removal process.

Figure 5:
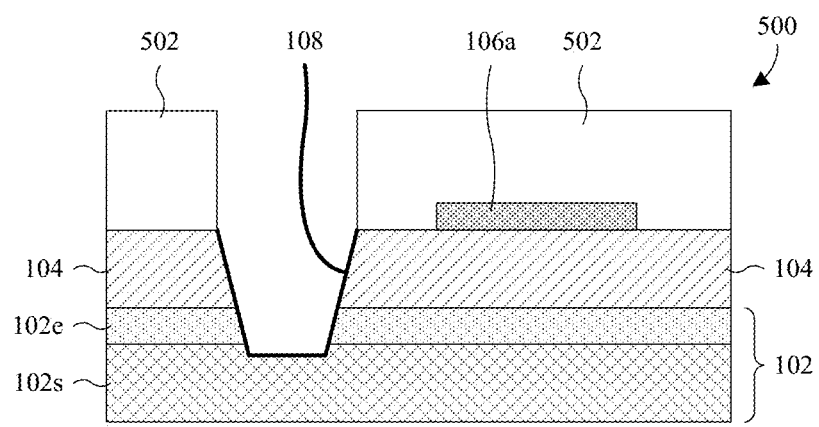

As illustrated by the cross-sectional view 500 of FIG. 5, the ILD layer 104 is patterned to form a trench 108 extending through the ILD layer 104 to the substrate 102. In some embodiments, the substrate 102 is also patterned, such that the trench 108 extends into the substrate 102. For example, the epitaxial layer 102e of the substrate 102 may be patterned, such that the trench 108 extends through the epitaxial layer 102e to the semiconductor substrate 102s of the substrate 102. Further, in some embodiments, the trench 108 extends laterally in a closed path to completely enclose the pad 106a. For example, the trench 108 may have a planar top layout that is ring shaped or ring shaped like. Note that this is not visible within the cross-sectional view 500. The patterning of the ILD layer 104 and, in some embodiments, the substrate 102 may, for example, be performed by a photolithography/etching process or some other suitable patterning process. In some embodiments, the photolithography/etching process comprises depositing a second photoresist layer 502 on the ILD layer 104 and the pad 106a, patterning the second photoresist layer 502 with a pattern of the trench 108, performing an etch into the ILD layer 104 and the substrate 102 with the second photoresist layer 502 in place to transfer the pattern to the ILD layer 104 and the substrate 102, and removing the second photoresist layer 502.

Figure 6:
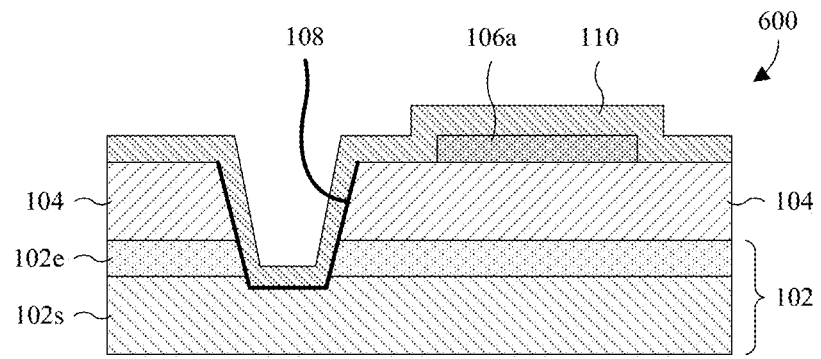

As illustrated by the cross-sectional view 600 of FIG. 6, a first passivation layer 110 is formed covering the ILD layer 104 and the pad 106a, and further lining the trench 108. The first passivation layer 110 may be or comprise, for example, silicon dioxide, aluminum oxide, silicon nitride, some other suitable dielectric, or any combination of the foregoing. In some embodiments, the first passivation layer 110 is or comprises the same material as the ILD layer 104, and/or is homogeneous (e.g., a single material). For example, the first passivation layer 110 and the ILD layer 104 may be or comprise, for example, silicon dioxide. Further, in other embodiments, the first passivation layer 110 is formed as a multi-layer film. For example, the first passivation layer 110 may be or comprise, for example, an aluminum oxide layer and a silicon dioxide layer covering the aluminum oxide layer. As another example, the first passivation layer 110 may be or comprise, for example, a silicon dioxide layer and a silicon nitride layer covering the silicon dioxide layer. In some embodiments, the first passivation layer 110 is formed by conformal deposition, and/or is formed by CVD, PVD, sputtering, some other suitable deposition process, or any combination of the foregoing.

Figure 7:
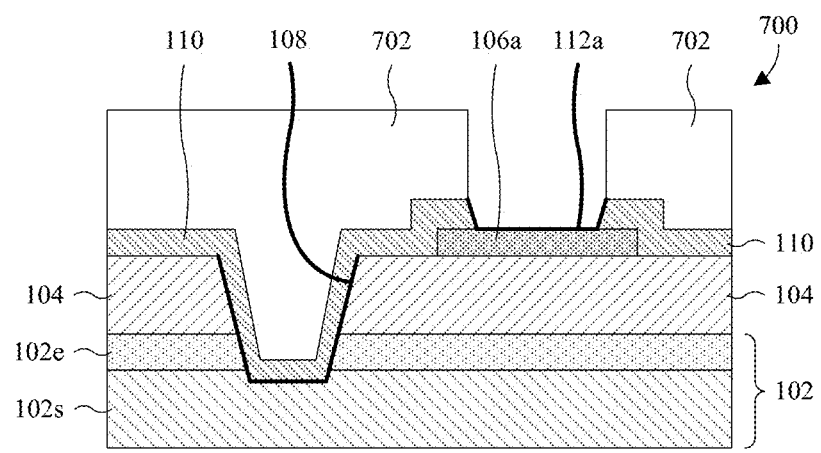

As illustrated by the cross-sectional view 700 of FIG. 7, the first passivation layer 110 is patterned to form a pad opening 112a overlying and exposing the pad 106a. The patterning of the first passivation layer 110 may, for example, be performed by a photolithography/etching process or some other suitable patterning process. In some embodiments, the photolithography/etching process comprises depositing a third photoresist layer 702 on the first passivation layer 110, patterning the third photoresist layer 702 with a pattern of the pad opening 112a, performing an etch into the first passivation layer 110 with the third photoresist layer 702 in place to transfer the pattern to the first passivation layer 110, and removing the third photoresist layer 702.

Figure 8:
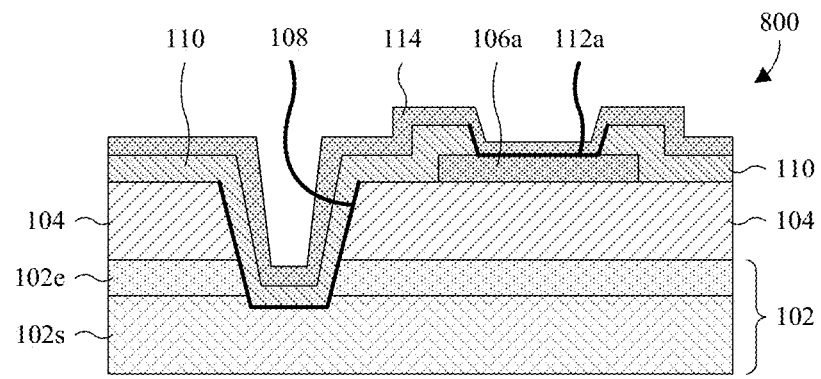

As illustrated by the cross-sectional view 800 of FIG. 8, a second passivation layer 114 is formed covering the ILD layer 104, the first passivation layer 110, and the pad 106a. Further, the second passivation layer 114 is formed lining sidewalls of the trench 108 over the first passivation layer 110, and is further formed lining sidewalls of the pad opening 112a. The second passivation layer 114 has a lower permeability for moisture and/or vapor than the ILD layer 104 and, in some embodiments, the first passivation layer 110. For example, the second passivation layer 114 may have a lower permeability for water vapor than the ILD layer 104 and/or the first passivation layer 110. Further, in some embodiments, the second passivation layer 114 has a lower WVTR than the ILD layer 104 and/or the first passivation layer 110. The second passivation layer 114 may be or comprise, for example, silicon nitride, aluminum oxide, polyimide, some other suitable dielectric, or any combination of the foregoing. In some embodiments, the second passivation layer 114 is formed by conformal deposition, and/or is formed by CVD, PVD, sputtering, some other suitable deposition process, or any combination of the foregoing.

By lining the sidewalls of the trench 108 and the sidewalls of the pad opening 112a, the second passivation layer 114 covers weak points in the trench 108 and the pad opening 112a through which moisture and/or vapor may enter the IC. For example, the ILD layer 104 and the first passivation layer 110 may be or comprise silicon dioxide, which has a high permeability for moisture and/or vapor and is hence a weak point in the trench 108 and the pad opening 112a. Further, because the second passivation layer 114 has a low permeability for moisture and/or vapor, the second passivation layer 114 may prevent moisture and/or vapor from entering the IC through the weak points. Therefore, the second passivation layer 114 may allow the IC to pass THB coupon testing. Further, the second passivation layer 114 may prevent delamination of the first passivation layer 110, damage to semiconductor devices (not shown) in the substrate 102, damage to conductive features (not shown) in the ILD layer 104 and the first passivation layer 110, or any combination of the foregoing.

Figure 9:
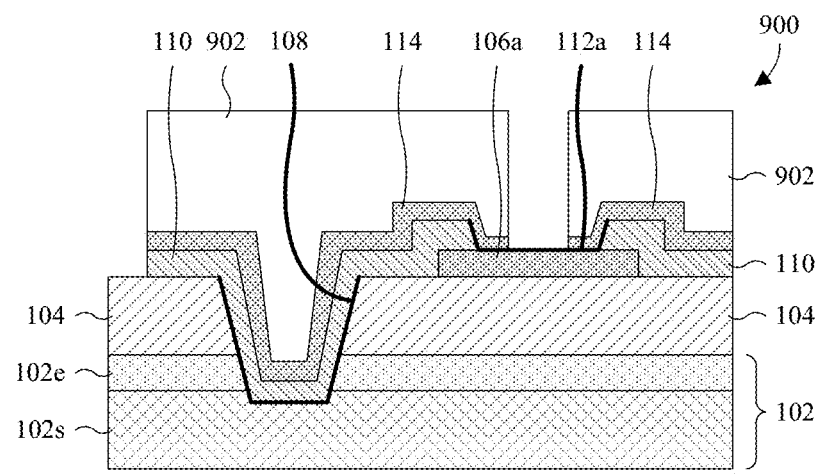

As illustrated by the cross-sectional view 900 of FIG. 9, the second passivation layer 114 is patterned to partially clear the pad opening 112a and to expose the pad 106a. The patterning of the second passivation layer 114 may, for example, be performed by a photolithography/etching process or some other suitable patterning process. In some embodiments, the photolithography/etching process comprises depositing a fourth photoresist layer 902 on the second passivation layer 114, patterning the fourth photoresist layer 902 with a desired pattern for the second passivation layer 114, performing an etch into the second passivation layer 114 with the fourth photoresist layer 902 in place to transfer the pattern to the second passivation layer 114, and removing the fourth photoresist layer 902.

Figure 10:
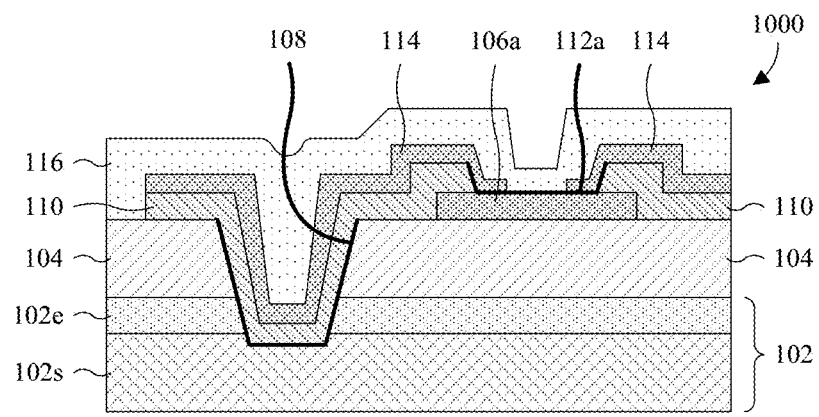

As illustrated by the cross-sectional view 1000 of FIG. 10, in some embodiments, a third passivation layer 116 is formed covering the ILD layer 104, the second passivation layer 114, and the pad 106a. In some embodiments, the third passivation layer 116 has a lower permeability for moisture and/or vapor than the ILD layer 104 and/or the first passivation layer 110. For example, the third passivation layer 116 may have a lower permeability for water vapor than the ILD layer 104 and/or the first passivation layer 110. Further, in some embodiments, the third passivation layer 116 has a lower WVTR than the ILD layer 104 and/or the first passivation layer 110. The third passivation layer 116 may be or comprise, for example, polyimide, some other suitable dielectric, or any combination of the foregoing. In some embodiments, the third passivation layer 116 is formed by conformal deposition, and/or is formed by CVD, PVD, sputtering, some other suitable deposition process, or any combination of the foregoing.

Figure 11:
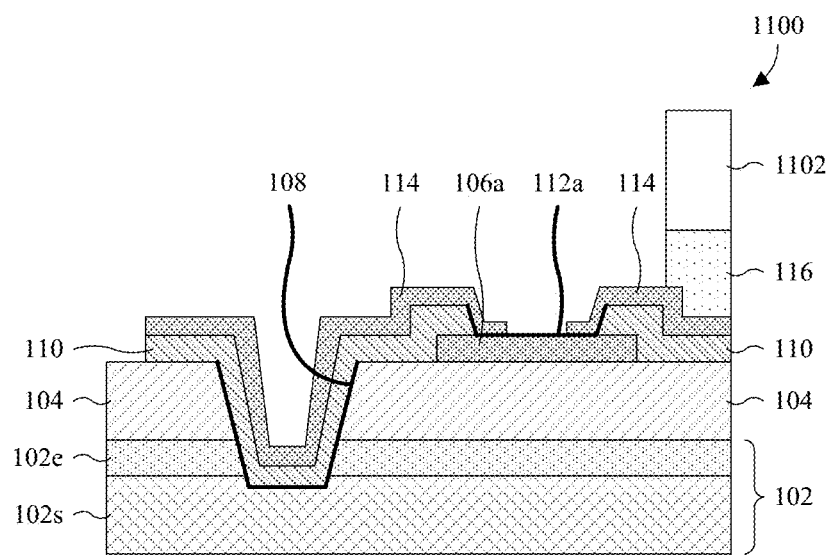

As illustrated by the cross-sectional view 1100 of FIG. 11, in some embodiments, the third passivation layer 116 is patterned to clear the third passivation layer 116 from the trench 108 and the pad opening 112a. The patterning of the third passivation layer 116 may, for example, be performed by a photolithography/etching process or some other suitable patterning process. In some embodiments, the photolithography/etching process comprises depositing a fifth photoresist layer 1102 on the third passivation layer 116, patterning the fifth photoresist layer 1102 with a desired pattern for the third passivation layer 116, performing an etch into the third passivation layer 116 with the fifth photoresist layer 1102 in place to transfer the pattern to the third passivation layer 116, and removing the fifth photoresist layer 1102.

With reference to FIGS. 12-15, a series of cross-sectional views 1200-1500 of some alternative embodiments of the method for manufacturing an IC with an enhanced passivation scheme for pad openings and trenches is provided. The alternative embodiments may, for example, be employed to manufacture the IC of FIG. 3E. Further, the alternative embodiments may, for example, include the acts of FIG. 4, such that the acts of FIG. 12 proceed from acts of FIG. 4.

Figure 12:
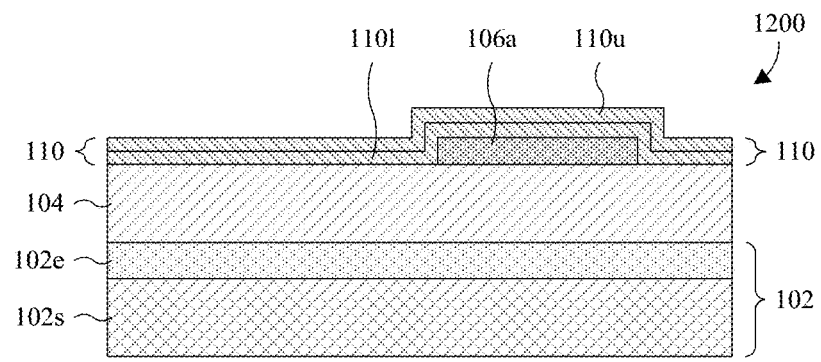
FIGS. 12-16 illustrate a series of cross-sectional views of some alternative embodiments of the method of FIGS. 4-11.

As illustrated by the cross-sectional view 1200 of FIG. 12, a first passivation layer 110 is formed covering the ILD layer 104 and the pad 106a. The first passivation layer 110 may be or comprise, for example, silicon dioxide, aluminum oxide, silicon nitride, some other suitable dielectric, or any combination of the foregoing. In some embodiments, the first passivation layer 110 is or comprises the same material as the ILD layer 104, and/or is homogeneous (e.g., a single material). Further, in some embodiments, the first passivation layer 110 is formed as a multi-layer film. For example, the first passivation layer 110 may comprise a lower layer 1101 and an upper layer 110u covering the lower layer 1101. The upper layer 110u may be or comprise, for example, silicon nitride or some other suitable dielectric, and/or the lower layer 1101 may be or comprise, for example, silicon oxide or some other suitable dielectric. In some embodiments, the first passivation layer 110 is formed by conformal deposition, and/or is formed by CVD, PVD, sputtering, some other suitable deposition process, or any combination of the foregoing.

Figure 13:
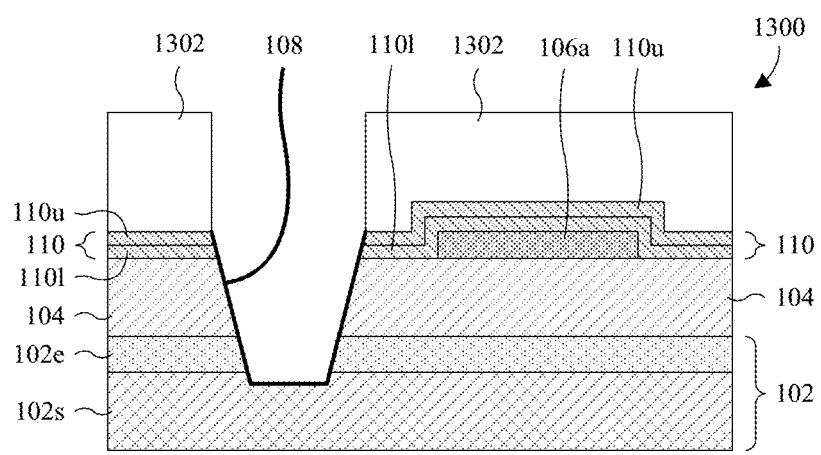

As illustrated by the cross-sectional view 1300 of FIG. 13, the first passivation layer 110 and the ILD layer 104 are patterned to form a trench 108 extending through the ILD layer 104 to the substrate 102. In some embodiments, the substrate 102 is also patterned, such that the trench 108 also extends into the substrate 102. For example, the epitaxial layer 102e of the substrate 102 may be patterned, such that the trench 108 also extends through the epitaxial layer 102e to the semiconductor substrate 102s of the substrate 102. Further, in some embodiments, the trench 108 extends laterally in a closed path to completely enclose the pad 106a. Note that this is not visible within the cross-sectional view 1300. The patterning of the ILD layer 104 and, in some embodiments, the substrate 102 may, for example, be performed by a photolithography/etching process or some other suitable patterning process. In some embodiments, the photolithography/etching process comprises depositing a sixth photoresist layer 1302 on the first passivation layer 110, patterning the sixth photoresist layer 1302 with a pattern of the trench 108, performing an etch into the first passivation layer 110, the ILD layer 104, and the substrate 102 with the sixth photoresist layer 1302 in place to transfer the pattern to the first passivation layer 110, the ILD layer 104, and the substrate 102, and removing the sixth photoresist layer 1302.

Figure 14:
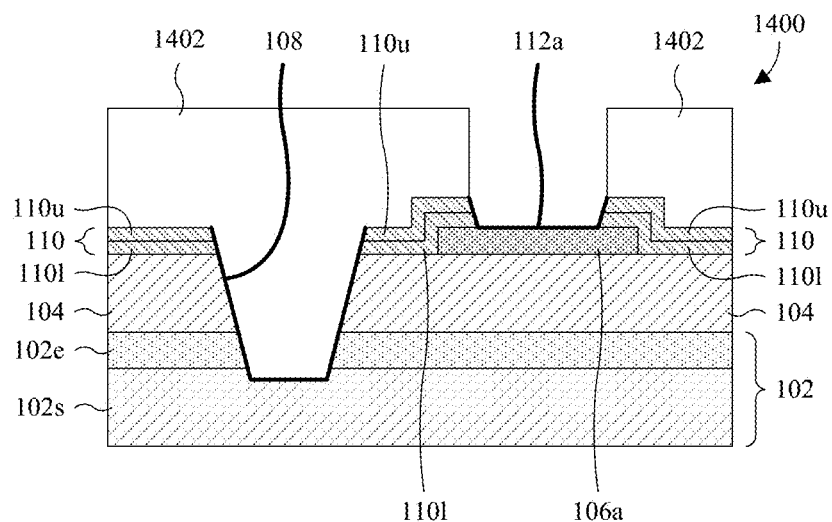

As illustrated by the cross-sectional view 1400 of FIG. 14, the first passivation layer 110 is patterned to form a pad opening 112a overlying and exposing the pad 106a. The patterning of the first passivation layer 110 may, for example, be performed by a photolithography/etching process or some other suitable patterning process, and/or may, for example, be performed by the same photolithography/etching process used to form the trench 108. In some embodiments, the photolithography/etching process comprises depositing a seventh photoresist layer 1402 on the first passivation layer 110, patterning the seventh photoresist layer 1402 with a pattern of the pad opening 112a, performing an etch into the first passivation layer 110 with the seventh photoresist layer 1402 in place to transfer the pattern to the first passivation layer 110, and removing the seventh photoresist layer 1402.

Figure 15:
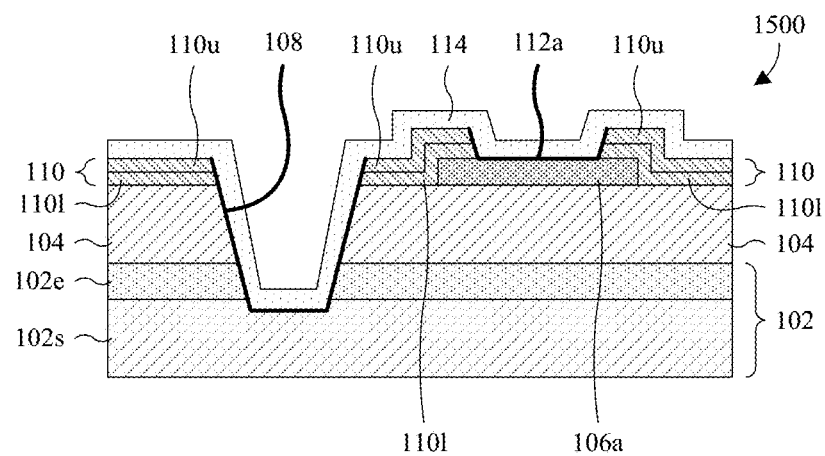

As illustrated by the cross-sectional view 1500 of FIG. 15, a second passivation layer 114 is formed covering the ILD layer 104, the first passivation layer 110, and the pad 106a. Further, the second passivation layer 114 is formed lining sidewalls of the trench 108 and sidewalls of the pad opening 112a. The second passivation layer 114 has a lower permeability for moisture and/or vapor than the ILD layer 104 and, in some embodiments, the first passivation layer 110. In some embodiments, the second passivation layer 114 has a lower WVTR than the ILD layer 104 and/or the first passivation layer 110. The second passivation layer 114 may be or comprise, for example, silicon nitride, aluminum oxide, polyimide, some other suitable dielectric, or any combination of the foregoing. In some embodiments, the second passivation layer 114 is formed by conformal deposition, and/or is formed by CVD, PVD, sputtering, some other suitable deposition process, or any combination of the foregoing.

Figure 16:
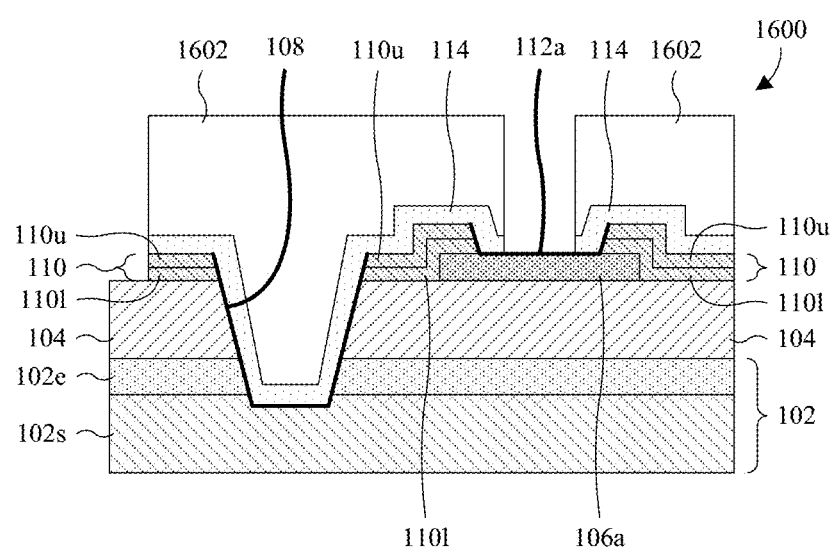

As illustrated by the cross-sectional view 1600 of FIG. 16, the second passivation layer 114 is patterned to partially clear the pad opening 112a and to expose the pad 106a. The patterning of the second passivation layer 114 may, for example, be performed by a photolithography/etching process or some other suitable patterning process. In some embodiments, the photolithography/etching process comprises depositing a eighth photoresist layer 1602 on the second passivation layer 114, patterning the eighth photoresist layer 1602 with a desired pattern for the second passivation layer 114, performing an etch into the second passivation layer 114 with the eighth photoresist layer 1602 in place to transfer the pattern to the second passivation layer 114, and removing the eighth photoresist layer 1602.

Figure 17:
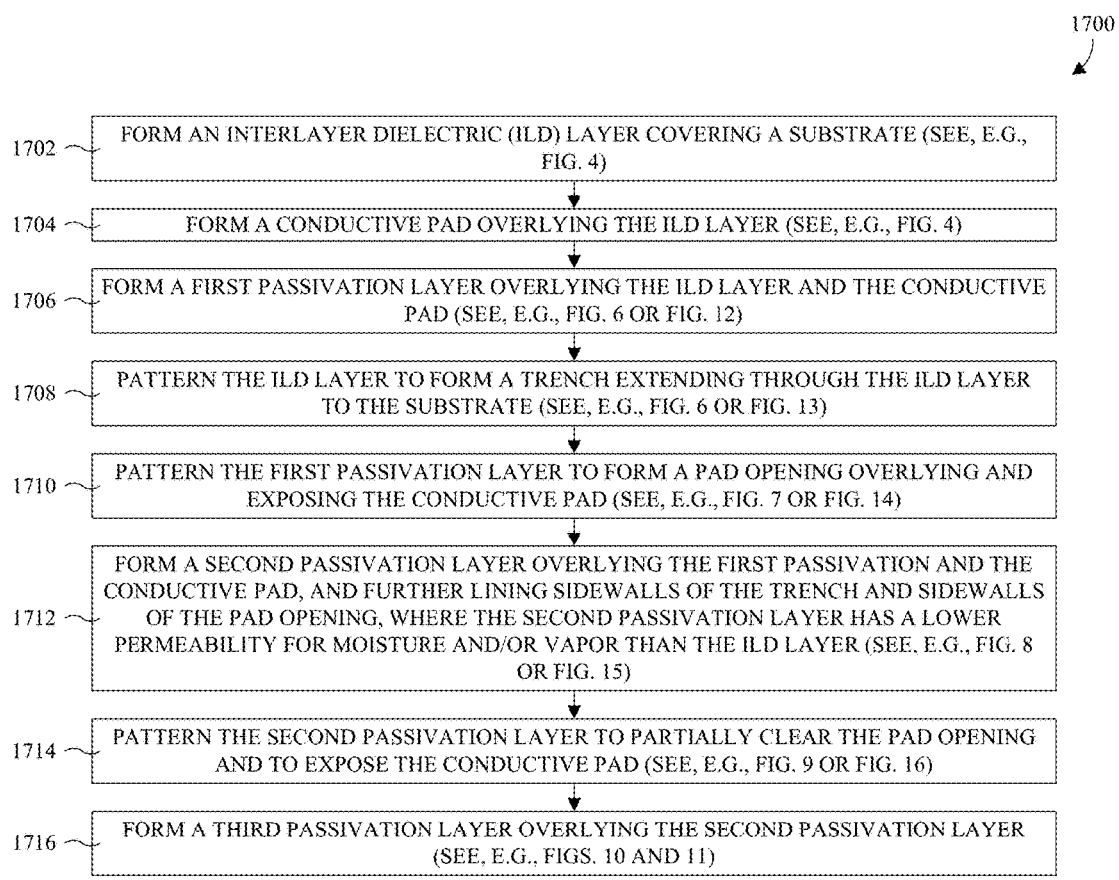
FIG. 17 illustrates a flowchart of some embodiments of the method of FIGS. 4-16.

With reference to FIG. 17, a flowchart 1700 of some embodiments of the method of FIGS. 4-16 is provided.

At 1702, an ILD layer is formed covering a substrate. See, for example, FIG. 4. In some embodiments, the substrate comprises a silicon substrate and a group III-V layer covering the silicon substrate.

At 1704, a conductive pad is formed overlying the ILD layer. See, for example, FIG. 4. In some embodiments, the conductive pad is electrically coupled to semiconductor devices in a top of the substrate through wires and vias alternatingly stacked in the ILD layer.

At 1706, a first passivation layer is formed overlying the ILD layer and the conductive pad. See, for example, FIG. 6 or FIG. 12.

At 1708, the ILD layer is patterned to form a trench extending through the ILD layer to the substrate. See, for example, FIG. 6 or FIG. 13. In some embodiments, the group III-V layer is also patterned, so the trench extends through the group III-V layer to the silicon substrate.

At 1710, the first passivation layer is patterned to form a pad opening overlying and exposing the conductive pad. See, for example, FIG. 7 or FIG. 14.

At 1712, a second passivation layer is formed overlying the first passivation layer and the conductive pad, and further lining sidewalls of the trench and sidewalls of the pad opening, where the second passivation layer has a lower permeability for moisture and/or vapor than the ILD layer. See, for example, FIG. 8 or FIG. 15. In some embodiments, the second passivation layer directly lines the sidewalls of the trench and the sidewalls of the pad opening. In other embodiments, the second passivation layer lines the sidewalls of the trench over the first passivation layer. Further, in some embodiments, the second passivation layer also has a lower WVTR than the ILD layer.

At 1714, the second passivation layer is patterned to partially clear the pad opening and to expose the conductive pad. See, for example, FIG. 9 or FIG. 16.

At 1716, a third passivation layer is formed overlying the second passivation layer. See, for example, FIGS. 10 and 11.

By forming the second passivation layer with a lower permeability for moisture and/or vapor than the ILD layer, and further lining the sidewalls of the trench and the sidewalls of the pad opening, the second passivation layer prevents moisture and/or vapor from entering the IC through the sidewalls of the trench and the sidewalls of the pad opening. Therefore, the second passivation layer may allow the IC to pass THB coupon testing. Further, the second passivation layer may prevent delamination of the first passivation layer, damage to semiconductor devices (not shown) in the substrate, damage to conductive features (not shown) in the ILD layer and the first passivation layer, or any combination of the foregoing.

While the flowchart 1700 of FIG. 17 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In some embodiments, the present application is directed towards an integrated circuit including: a substrate; an ILD layer covering the substrate, wherein the ILD layer at least partially defines a trench, and wherein the trench extends through the ILD layer from a top of the ILD layer to the substrate; a conductive pad overlying the ILD layer; a first passivation layer overlying the ILD layer and the conductive pad, wherein the first passivation layer defines a pad opening overlying the conductive pad; and a second passivation layer overlying the ILD layer, the conductive pad, and the first passivation layer, and further lining sidewalls of the first passivation layer in the pad opening and sidewalls of the ILD layer in the trench. In some embodiments, the first passivation layer partially defines the trench, wherein the second passivation layer directly lines additional sidewalls of the first passivation layer in the trench, and wherein the second passivation layer directly lines the sidewalls of the ILD layer in the trench. In some embodiments, the second passivation layer has an upper surface in the trench, wherein the upper surface of the second passivation layer is recessed below a top surface of the second passivation layer and a top surface of the ILD layer. In some embodiments, the first passivation layer directly lines the sidewalls of the ILD layer in the trench, wherein the second passivation layer lines the sidewalls of the ILD layer over the first passivation layer. In some embodiments, the first passivation layer has an upper surface in the trench, wherein the upper surface of the first passivation layer is recessed below a top surface of the first passivation layer and a top surface of the ILD layer, wherein the second passivation layer has an upper surface in the trench, and wherein the upper surface of the second passivation layer is recessed below a top surface of the second passivation layer and the top surface of the ILD layer. In some embodiments, a portion of the second passivation layer in the trench has a U-shaped or V-shaped cross-sectional profile. In some embodiments, the trench extends laterally in a closed path to completely enclose a central portion of the ILD layer, and to separate the central portion of the ILD layer from a peripheral portion of the ILD layer, wherein the conductive pad is on the central portion of the ILD layer, and wherein the second passivation layer extends continuously from directly over the peripheral portion of the ILD layer to the conductive pad through the trench. In some embodiments, the ILD layer includes oxide, and wherein the second passivation layer includes silicon nitride, aluminum oxide, or polyimide. In some embodiments, the substrate includes: a bulk semiconductor substrate; and a group III-V layer covering the bulk semiconductor substrate, wherein the ILD layer covers the group III-V layer, wherein the trench extends through the group III-V layer to the bulk semiconductor substrate, and wherein the trench is partially defined by the group III-V layer.

In some embodiments, the present application is directed towards a method for forming an integrated circuit, the method including: depositing an ILD layer covering a substrate; forming a conductive pad overlying the ILD layer; performing a first etch into the ILD layer to form a trench, wherein the trench extends through the ILD layer from a top of the ILD layer to the substrate; depositing a first passivation layer covering the ILD layer and the conductive pad; performing a second etch into the first passivation layer to form a pad opening overlying and exposing the conductive pad; and depositing a second passivation layer covering the ILD layer, the conductive pad, and the first passivation layer, and further lining sidewalls of the first passivation layer in the pad opening and sidewalls of the ILD layer in the trench, wherein the second passivation layer has a low permeability for moisture or vapor relative to the ILD layer. In some embodiments, the first passivation layer is deposited before the first etch, wherein the first etch is also performed into the first passivation layer, such that the trench extends through the first passivation layer, and wherein the second passivation layer lines additional sidewalls of the first passivation layer in the trench. In some embodiments, the first passivation layer is deposited after the first etch, wherein the first passivation layer lines the sidewalls of the ILD layer in the trench, and wherein the second passivation layer lines the sidewalls of the ILD layer over the first passivation layer. In some embodiments, the method further includes performing a third etch into the second passivation layer to partially clear the pad opening and to expose the conductive pad. In some embodiments, the substrate includes a group III-V layer, and the method further includes forming a semiconductor device overlying and partially defined by the group III-V layer, wherein the ILD layer is formed covering the semiconductor device and the group III-V layer. In some embodiments, the trench is formed with a ring-shaped top layout and extends laterally in a closed path to completely enclose the conductive pad. In some embodiments, the ILD layer directly contacts the first passivation layer and the conductive pad, wherein the second passivation layer directly contacts the first passivation layer and the conductive pad.

In some embodiments, the present provides another integrated circuit including: a semiconductor substrate; a group III-V layer covering the semiconductor substrate; a semiconductor device overlying and partially defined by the group III-V layer; an interconnect structure covering the semiconductor device and the group III-V layer, wherein the interconnect structure includes an ILD layer, a plurality of wires, and a plurality of vias, wherein the wires and the vias are alternatingly stacked in the ILD layer, wherein the ILD layer and the group III-V layer at least partially define a trench, and wherein the trench extends laterally in a closed path to completely enclose the semiconductor device; a conductive pad overlying the ILD layer and electrically coupled to the semiconductor device by the wires and the vias; a first passivation layer overlying the ILD layer and the conductive pad, wherein the first passivation layer defines a pad opening overlying the conductive pad; and a second passivation layer overlying the ILD layer, the conductive pad, and the first passivation layer, and further lining sidewalls of the first passivation layer in the pad opening and sidewalls of the ILD layer in the trench, wherein the second passivation layer has a low permeability for water vapor relative to the ILD layer. In some embodiments, the first passivation layer also has a low permeability for water vapor relative to the ILD layer. In some embodiments, the trench separates a central portion of the ILD layer from a peripheral portion of the ILD layer, wherein the first passivation layer extends continuously from the peripheral portion of the ILD layer to the central portion of the ILD layer while lining and directly contacting the sidewalls of the ILD layer in the trench, wherein the ILD layer partially fills the trench, wherein the second passivation layer overlies and directly contacts the first passivation layer in the trench, and wherein the second passivation layer directly contacts the conductive pad. In some embodiments, the trench separates a central portion of the ILD layer from a peripheral portion of the ILD layer, wherein the second passivation layer extends continuously from directly over the peripheral portion of the ILD layer to the conductive pad while lining and directly contacting the sidewalls of the ILD layer in the trench, wherein the second passivation directly contacts the first passivation layer in the trench, and wherein the second passivation layer directly contacts the conductive pad on the central portion of the ILD layer.

In some embodiments, the present application provides another method for forming an integrated circuit, the method including: forming a semiconductor device overlying and partially defined by a substrate; forming an interconnect structure covering the semiconductor device and the substrate, wherein the interconnect structure includes an ILD layer, a plurality of wires, and a plurality of vias, wherein the wires and the vias are alternatingly stacked in the ILD layer; forming a conductive pad overlying the ILD layer and electrically coupled to the semiconductor device by the wires and the vias; performing a first etch into the ILD layer to form a trench in the ILD layer, where the trench extends vertically through the ILD layer to the substrate, and wherein the trench extends laterally in a closed path to completely enclose the semiconductor device; forming a first passivation layer covering the ILD layer and the conductive pad; performing a second etch into the first passivation layer to form a pad opening overlying and exposing the conductive pad; forming a second passivation layer covering the ILD layer, the conductive pad, and the first passivation layer, wherein the second passivation layer lines sidewalls of the first passivation layer in the pad opening and a top surface of the conductive pad in the pad opening, wherein the second passivation layer further lines sidewalls of the ILD layer in the trench, and wherein the second passivation layer has a low permeability for water vapor relative to the ILD layer; and performing a third etch into second passivation layer to partially clear the second passivation layer from the top surface of the conductive pad. In some embodiments, the method further includes forming a group III-V layer covering a semiconductor substrate, wherein the semiconductor device is formed overlying and partially defined by the group III-V layer, and wherein the first etch is also performed into the group III-V layer, such that the trench is at least partially defined by the ILD layer and the group III-V layer. In some embodiments, the first passivation layer is formed before the first etch, wherein the first etch is also performed into the first passivation layer, such that the trench is at least partially defined by the ILD layer and the first passivation layer, and wherein the second passivation layer is formed lining and directly contacting the sidewalls of the ILD layer in the trench. In some embodiments, the second passivation layer is formed by conformal deposition. In some embodiments, the first passivation layer is formed after the first etch, wherein the first passivation layer is formed lining and directly contacting the sidewalls of the ILD layer in the trench, and wherein the second passivation is formed lining and directly contacting the first passivation layer in the trench. In some embodiments, the first and second passivation layers are formed by conformal deposition.

In some embodiments, the present application provides another integrated circuit including: a substrate; a semiconductor device overlying and partially defined by the substrate; an ILD layer covering the substrate and the semiconductor device, wherein the ILD layer at least partially defines a trench, wherein the trench extends vertically through the ILD layer to the substrate, and wherein the trench extends laterally in a closed path to completely enclose the semiconductor device; a first passivation layer overlying the ILD layer; and a second passivation layer overlying the first passivation layer, and further lining sidewalls of the ILD layer in the trench, wherein the second passivation layer has a low permeability for moisture or vapor relative to the ILD layer. In some embodiments, the trench separates the ILD layer into a central portion and a peripheral portion, wherein the central portion of the ILD layer is completely enclosed by the trench, and wherein the second passivation layer extends continuously from directly over the peripheral portion of the ILD layer to the central portion of the ILD layer and is recessed into the trench. In some embodiments, the first passivation layer also extends continuously from directly over the peripheral portion of the ILD layer to the central portion of the ILD layer and is recessed into the trench. In some embodiments, the trench has a ring-shaped top layout. In some embodiments, the substrate includes: a bulk silicon substrate; and a GaN layer covering the bulk silicon substrate, wherein the semiconductor device overlies and is partially defined by the GaN layer. In some embodiments, the ILD layer and the first passivation layer include oxide and directly contact at an oxide-to-oxide interface along a top surface of the ILD layer, and wherein the second passivation layer includes silicon nitride, polyimide, or aluminum oxide. In some embodiments, the integrated circuit further includes a third passivation layer overlying the second passivation layer and the ILD layer, and further lining sidewalls of the second passivation layer in the trench, wherein the first, second, and third passivation layers are different materials, and wherein the first, second, and third passivation layers are stacked and recessed into the trench. In some embodiments, the first and second passivation layers each have U-shaped or V-shaped cross-sectional profiles.

In some embodiments, the present application provides another integrated circuit including: a substrate; an interconnect structure covering the substrate; an ILD layer covering the substrate, wherein the interconnect structure includes an ILD layer, a plurality of wires, and a plurality of vias, and wherein the wires and the vias are alternatingly stacked in the ILD layer; a conductive pad overlying the ILD layer; a first passivation layer overlying the conductive pad, and further defining a pad opening overlying the conductive pad; and a second passivation layer overlying the first passivation layer, and further lining sidewalls of the pad opening, wherein the second passivation layer has a low permeability for moisture or vapor relative to the ILD layer. In some embodiments, the sidewalls of the pad opening are respectively on opposite sides of the pad, wherein the second passivation layer partially covers a bottom surface of the pad opening defined by the conductive pad, and wherein the second passivation layer protrudes towards a center of the pad opening, along the bottom surface of the pad opening, from each of the sidewalls of the pad opening. In some embodiments, the integrated circuit further includes a third passivation layer overlying the first and second passivation layers, and further lining sidewalls of the second passivation layer in the pad opening. In some embodiments, the sidewalls of the second passivation layer are respectively on opposite sides of the pad, wherein the third passivation layer partially covers a bottom surface of the pad opening defined by the conductive pad, and wherein the third passivation layer protrudes towards a center of the pad opening, along the bottom surface of the pad opening, from each of the sidewalls of the second passivation layer. In some embodiments, the second passivation layer has a pair of opposing cross-sectional profiles in the pad opening, and wherein the opposing cross-sectional profiles are stepped. In some embodiments, the first passivation layer lines and directly contacts sidewalls of the conductive pad, wherein the second passivation layer lines and directly contacts the sidewalls of the first passivation layer in the pad opening, and wherein the first passivation layer and the second passivation layer directly contact a top surface of the conductive pad.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit comprising:
    a substrate;
    an interlayer dielectric (ILD) layer covering the substrate, wherein the ILD layer at least partially defines a trench, and wherein the trench extends through the ILD layer from a top of the ILD layer to the substrate;
    a conductive pad overlying the ILD layer;
    a first passivation layer overlying the ILD layer and the conductive pad, wherein the first passivation layer defines a pad opening overlying the conductive pad; and
    a second passivation layer overlying the ILD layer, the conductive pad, and the first passivation layer, and further lining sidewalls of the first passivation layer in the pad opening and sidewalls of the ILD layer in the trench.

2. The integrated circuit according to claim 1, wherein the first passivation layer partially defines the trench, wherein the second passivation layer directly lines additional sidewalls of the first passivation layer in the trench, and wherein the second passivation layer directly lines the sidewalls of the ILD layer in the trench.

3. The integrated circuit according to claim 1, wherein the second passivation layer has an upper surface in the trench, and wherein the upper surface of the second passivation layer is recessed below a top surface of the second passivation layer and a top surface of the ILD layer.

4. The integrated circuit according to claim 1, wherein the first passivation layer directly lines the sidewalls of the ILD layer in the trench, and wherein the second passivation layer lines the sidewalls of the ILD layer over the first passivation layer.

5. The integrated circuit according to claim 1, wherein the first passivation layer has an upper surface in the trench, wherein the upper surface of the first passivation layer is recessed below a top surface of the first passivation layer and a top surface of the ILD layer, wherein the second passivation layer has an upper surface in the trench, and wherein the upper surface of the second passivation layer is recessed below a top surface of the second passivation layer and the top surface of the ILD layer.

6. The integrated circuit according to claim 1, wherein a portion of the second passivation layer in the trench has a U-shaped or V-shaped cross-sectional profile.

7. The integrated circuit according to claim 1, wherein the trench extends laterally in a closed path to completely enclose a central portion of the ILD layer, and to separate the central portion of the ILD layer from a peripheral portion of the ILD layer, wherein the conductive pad is on the central portion of the ILD layer, and wherein the second passivation layer extends continuously from directly over the peripheral portion of the ILD layer to the conductive pad through the trench.

8. The integrated circuit according to claim 1, wherein the ILD layer comprises oxide, and wherein the second passivation layer comprises silicon nitride, aluminum oxide, or polyimide.

9. The integrated circuit according to claim 1, wherein the substrate comprises:
    a bulk semiconductor substrate; and
    a group III-V layer covering the bulk semiconductor substrate, wherein the ILD layer covers the group III-V layer, wherein the trench extends through the group III-V layer to the bulk semiconductor substrate, and wherein the trench is partially defined by the group III-V layer.

10. An integrated circuit comprising:
    a semiconductor substrate;
    a group III-V layer covering the semiconductor substrate;
    a semiconductor device overlying and partially defined by the group III-V layer;
    an interconnect structure covering the semiconductor device and the group III-V layer, wherein the interconnect structure comprises an interlayer dielectric (ILD) layer, a plurality of wires, and a plurality of vias, wherein the wires and the vias are alternatingly stacked in the ILD layer, wherein the ILD layer and the group III-V layer at least partially define a trench, and wherein the trench extends laterally in a closed path to completely enclose the semiconductor device;
    a conductive pad overlying the ILD layer and electrically coupled to the semiconductor device by the wires and the vias;

a first passivation layer overlying the ILD layer and the conductive pad, wherein the first passivation layer defines a pad opening overlying the conductive pad; and a second passivation layer overlying the ILD layer, the conductive pad, and the first passivation layer, and further lining sidewalls of the first passivation layer in the pad opening and sidewalls of the ILD layer in the trench, wherein the second passivation layer has a low permeability for water vapor relative to the ILD layer.

11. The integrated circuit according to claim 10, wherein the first passivation layer also has a low permeability for water vapor relative to the ILD layer.

12. The integrated circuit according to claim 10, wherein the trench separates a central portion of the ILD layer from a peripheral portion of the ILD layer, wherein the first passivation layer extends continuously from the peripheral portion of the ILD layer to the central portion of the ILD layer while lining and directly contacting the sidewalls of the ILD layer in the trench, wherein the first passivation layer partially fills the trench, wherein the second passivation layer overlies and directly contacts the first passivation layer in the trench, and wherein the second passivation layer directly contacts the conductive pad.

13. The integrated circuit according to claim 10, wherein the trench separates a central portion of the ILD layer from a peripheral portion of the ILD layer, wherein the second passivation layer extends continuously from directly over the peripheral portion of the ILD layer to the conductive pad while lining and directly contacting the sidewalls of the ILD layer in the trench, wherein the second passivation directly contacts the first passivation layer in the trench, and wherein the second passivation layer directly contacts the conductive pad on the central portion of the ILD layer.

14. An integrated circuit comprising:
   a substrate;
   a dielectric layer on the substrate and at least partially defining a trench, wherein the trench extends through the dielectric layer from a top surface of the dielectric layer to a bottom surface of the dielectric layer;
   a conductive pad on the dielectric layer;
   a first passivation layer partially covering the conductive pad and defining a pad opening overlying and exposing the conductive pad; and
   a second passivation layer covering the first passivation layer, wherein the second passivation layer partially fills and is recessed into the trench and the pad opening.

15. The integrated circuit according to claim 14, wherein the second passivation layer directly contacts sidewalls of the dielectric layer in the trench.

16. The integrated circuit according to claim 14, wherein the first passivation layer partially fills and is recessed into the trench.

17. The integrated circuit according to claim 14, wherein the conductive pad is on a first side of the trench, and wherein the second passivation layer extends continuously from the conductive pad to a top-surface portion of the dielectric layer on a second side of the trench that is opposite the first side.

18. The integrated circuit according to claim 14, further comprising:
   a semiconductor device on the substrate, between the substrate and the dielectric layer;
   a plurality of wires; and
   a plurality of vias, wherein the wires and the vias are stacked in the dielectric layer and define a conductive path from the semiconductor device to the conductive pad.

19. The integrated circuit according to claim 14, wherein the trench has a top layout that is ring shaped.

20. The integrated circuit according to claim 14, wherein the second passivation layer has a low water vapor transmission rate (WVTR) relative to the dielectric layer, and wherein the second passivation layer seals sidewalls of the dielectric layer in the trench.

* * * * *